United States Patent
Adusumilli et al.

(10) Patent No.: US 10,600,860 B2
(45) Date of Patent: Mar. 24, 2020

(54) PRECISE/DESIGNABLE FINFET RESISTOR STRUCTURE

(71) Applicant: International Business Machines Corporation, Armonk, NY (US)

(72) Inventors: Praneet Adusumilli, Albany, NY (US); Shanti Pancharatnam, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 15/908,410

(22) Filed: Feb. 28, 2018

(65) Prior Publication Data
US 2018/0190755 A1 Jul. 5, 2018

Related U.S. Application Data

(62) Division of application No. 15/332,720, filed on Oct. 24, 2016, now Pat. No. 9,954,050.

(51) Int. Cl.
| | |
|---|---|
| *H01L 49/02* | (2006.01) |
| *H01L 29/78* | (2006.01) |
| *H01L 21/02* | (2006.01) |
| *H01L 21/768* | (2006.01) |
| *H01L 27/08* | (2006.01) |
| *H01L 27/06* | (2006.01) |
| *H01L 21/82* | (2006.01) |

(52) U.S. Cl.
CPC ........ *H01L 28/24* (2013.01); *H01L 21/02697* (2013.01); *H01L 21/76816* (2013.01); *H01L 27/0802* (2013.01); *H01L 29/785* (2013.01); *H01L 21/8213* (2013.01); *H01L 27/0629* (2013.01); *H01L 27/0635* (2013.01)

(58) Field of Classification Search
CPC ............... H01L 28/24; H01L 21/02697; H01L 21/76816; H01L 27/0802; H01L 29/785; H01L 21/8213; H01L 27/0629
See application file for complete search history.

(56) References Cited

U.S. PATENT DOCUMENTS

| | | |
|---|---|---|
| 6,720,231 B2 | 4/2004 | Fried et al. |
| 7,064,413 B2 | 6/2006 | Fried et al. |
| 8,796,772 B2 | 8/2014 | Yeh et al. |
| 8,816,436 B2 | 8/2014 | Cheng et al. |

(Continued)

OTHER PUBLICATIONS

List of IBM Patents or Patent Applications Treated as Related dated Feb. 28, 2018, 2 pages.

*Primary Examiner* — Zandra V Smith
*Assistant Examiner* — Andre C Stevenson
(74) *Attorney, Agent, or Firm* — Scully, Scott, Murphy & Presser, P.C.; Daniel P. Morris, Esq.

(57) ABSTRACT

A resistive material is formed straddling over each semiconductor fin that extends upward from a surface of a substrate. The resistive material is then disconnected by removing the resistive material from atop each semiconductor fin. Remaining resistive material in the form of a U-shaped resistive material liner is present between each semiconductor fin. Contact structures are formed perpendicular to each semiconductor fin and contacting a portion of a first set of the semiconductor fins and a first set of the U-shaped resistive material liners.

18 Claims, 9 Drawing Sheets

(56) References Cited

U.S. PATENT DOCUMENTS

| | | |
|---|---|---|
| 8,889,508 B2 | 11/2014 | Yeh et al. |
| 9,653,399 B2 | 5/2017 | Zhu et al. |
| 10,096,522 B2 | 10/2018 | Yang et al. |
| 10,276,499 B2 | 4/2019 | Peng et al. |
| 2010/0155843 A1 | 6/2010 | Mayer et al. |
| 2012/0094477 A1 | 4/2012 | Forbes et al. |
| 2012/0175749 A1 | 7/2012 | Haensch et al. |
| 2013/0099317 A1 | 4/2013 | Xia et al. |
| 2014/0151814 A1* | 6/2014 | Giles ............... H01L 21/823821 257/369 |
| 2015/0061076 A1 | 3/2015 | Cheng et al. |
| 2015/0179503 A1* | 6/2015 | Tsai ................. H01L 21/76224 257/347 |
| 2015/0333057 A1 | 11/2015 | Hoentschel et al. |
| 2016/0141393 A1 | 5/2016 | Hoentschel et al. |

\* cited by examiner

PRECISE/DESIGNABLE FINFET RESISTOR STRUCTURE

BACKGROUND

The present application relates to a semiconductor structure and a method of forming the same. More particularly, the present application relates to a semiconductor structure including a plurality of U-shaped resistive material liners located between each semiconductor fin that is present on a surface of a substrate, and contact structures in contact with a portion of a first set of the semiconductor fins and with a portion of a first set of the U-shaped resistive material liners. The present application also relates to a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

Front-end-of-the-line (FEOL) resistors are normally created with active materials (e.g., Si/SiGe), gate materials (e.g., doped polysilicon) or metals or metal alloys (e.g., tantalum nitride). Different resistivity resistors are usually offered using polysilicon resistors, metal resistors and diffusion resistors. Tuning the resistor value accurately to a specific application is highly desired and can be difficult using prior resistor architecture. There is thus a need for providing a resistor architecture that can be accurately tuned.

SUMMARY

A resistive material is formed straddling over each semiconductor fin that extends upward from a surface of a substrate. The resistive material is then disconnected by removing the resistive material from atop each semiconductor fin. Remaining resistive material in the form of a U-shaped resistive material liner is present between each semiconductor fin. Contact structures are formed perpendicular to each semiconductor fin and contacting a portion of a first set of the semiconductor fins and a first set of the U-shaped resistive material liners. The resistivity value of the structure can be tuned by any of the following: (1) choice of resistive material employed as the U-shaped resistive material liner, (2) the thickness of the U-shaped resistive material liner, (3) the number of semiconductor fins and U-shaped resistive material liners contacted, (4) length between contact structures, and (5) height of each semiconductor fin.

In one aspect of the present application, a semiconductor structure (e.g., a FinFET resistor structure) is provided. In one embodiment of the present application, the semiconductor structure includes a plurality of semiconductor fins extending upward from a surface of a substrate. A U-shaped resistive material liner is located between each neighboring pair of semiconductor fins. A middle-of-the-line (MOL) dielectric material is located above each U-shaped resistive material liner and a topmost surface of each semiconductor fin. Contact structures are located in the MOL dielectric material and contacting a portion of a first set of the semiconductor fins and a portion of a first set of the U-shaped resistive material liners.

In another aspect of the present application, a method of forming a semiconductor structure (e.g., a FinFET resistor structure) is provided. In one embodiment of the present application, the method includes forming a layer of resistive material straddling over each semiconductor fin of a plurality of semiconductor fins. Next, the layer of resistive material is removed from a topmost surface of each semiconductor fin, wherein a U-shaped resistive material liner remains between each semiconductor fin of the plurality of semiconductor fins. Contact structures are then formed perpendicular to each semiconductor fin, wherein each contact structure contacts a portion of a first set of the semiconductor fins and a portion of a first set of the U-shaped resistive material liners.

DETAILED DESCRIPTION

Figure 1:
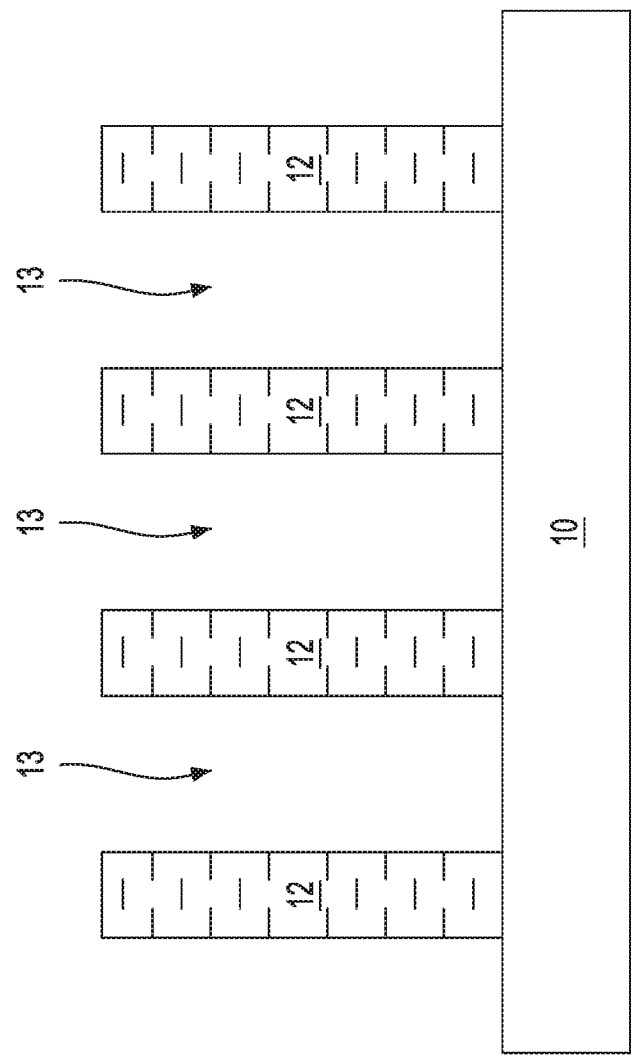
FIG. 1 is a cross sectional view of an exemplary semiconductor structure including a plurality of semiconductor fins extending upward from a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of semiconductor fins 12 extending upward from a surface of a substrate 10. The number of semiconductor fins 12 that are located on substrate 10 may vary as long as at least two semiconductor fins 12 are present.

The exemplary semiconductor structure shown in FIG. 1 can be formed by first providing a semiconductor substrate. In one embodiment, the semiconductor substrate may be a bulk semiconductor substrate. The term "bulk" when used in conjunction with the term "semiconductor substrate" denotes a substrate that is entirely composed of at least one semiconductor material having semiconducting properties; no insulator materials and/or conductive materials are present in a bulk semiconductor substrate. In such an embodiment and after performing a patterning process (to be defined in greater detail below), an upper portion of the bulk semiconductor substrate constitutes the semiconductor fins 12, while a remaining portion of the bulk semiconductor substrate constitutes the substrate 10.

Examples of semiconductor materials that may provide at least a portion of the bulk semiconductor substrate include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the bulk semiconductor substrate may be entirely composed of silicon. In another example, the bulk semiconductor substrate may include a multilayered semiconductor material stack of, and in any order, Si and a silicon germanium alloy.

The semiconductor material that provides the bulk semiconductor substrate may be a single crystalline semiconductor material. The semiconductor material that provides the bulk semiconductor substrate may have any of the well known crystal orientations. For example, the crystal orientation of the bulk semiconductor substrate may be {100}, {110}, or {111}. Other crystallographic orientations besides those specifically mentioned can also be used in the present application.

In another embodiment, the semiconductor substrate that may be used is a semiconductor-on-insulator (SOI) substrate. The SOI substrate may include a handle substrate, an insulator layer and a topmost semiconductor material layer. In some embodiments, the handle substrate may be omitted. When an SOI substrate is employed, the topmost semiconductor material layer of the SOI substrate is patterned into the semiconductor fins 12 shown in FIG. 1, while substrate 10 includes the insulator layer and, if present, the handle substrate of the SOI substrate.

The handle substrate of the SOI substrate may include a semiconductor material or a non-semiconductor material such as, for example, a dielectric material and/or a conductive material. When the handle substrate is a semiconductor material, the semiconductor material that provides the handle substrate may include one of the semiconductor materials mentioned above for the bulk semiconductor substrate. The semiconductor material that can provide the handle substrate can be a single crystalline semiconductor material and it can have any of the crystal orientations mentioned above for the semiconductor material that provides the bulk semiconductor substrate.

The insulator layer of the SOI substrate may be a crystalline or non-crystalline dielectric material. In one embodiment, the insulator layer of the SOI substrate is a dielectric oxide such as, for example, silicon dioxide. In another embodiment, the insulator layer of the SOI substrate is a dielectric nitride such as, for example, silicon nitride or boron nitride. In yet another embodiment, the insulator layer of the SOI substrate may include a multilayered stack of different dielectric materials. In one example, the insulator layer may include a multilayered stack of, and in any order, silicon dioxide and boron nitride.

The topmost semiconductor layer of the SOI substrate may include one of the semiconductor materials mentioned above for the bulk semiconductor substrate. The semiconductor material that can provide the topmost semiconductor layer of the SOI substrate can be a single crystalline semiconductor material and it can have any of the crystal orientations mentioned above for the semiconductor material that provides the bulk semiconductor substrate. The semiconductor material that provides the topmost semiconductor layer of the SOI substrate may be the same as, or different from, a semiconductor material that provides the handle substrate.

After providing the semiconductor substrate (i.e., bulk or SOI), the semiconductor substrate can patterned to provide a plurality of semiconductor fins 12 extending upward from substrate 10. Each semiconductor fin 12 constitutes either a remaining upper portion of a bulk semiconductor substrate or the topmost semiconductor layer of an SOI substrate, and substrate 10 constitutes either a remaining portion of the bulk semiconductor substrate or at least the insulator layer of the SOI substrate. In some embodiments, no material interface exists between the semiconductor fins 12 and the substrate 10. In other embodiments, a material interface exists between the semiconductor fins 12 and the substrate 10.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the semiconductor fins 12 shown in FIG. 1 of the present application.

In another embodiment, patterning may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 has a height from 20 nm to 200 nm, and a width from 5 nm to 30 nm. Other heights and/or widths that are lesser than, or greater than, the ranges mentioned herein can also be used in the present application. Each semiconductor fin 12 is spaced apart from its nearest neighboring semiconductor fin 12 by a pitch of from 20 nm to 100 nm. Also, each semiconductor fin 12 is oriented parallel to each other. A gap 13 is present between each neighboring pairs of semiconductor fins 12.

Figure 2:
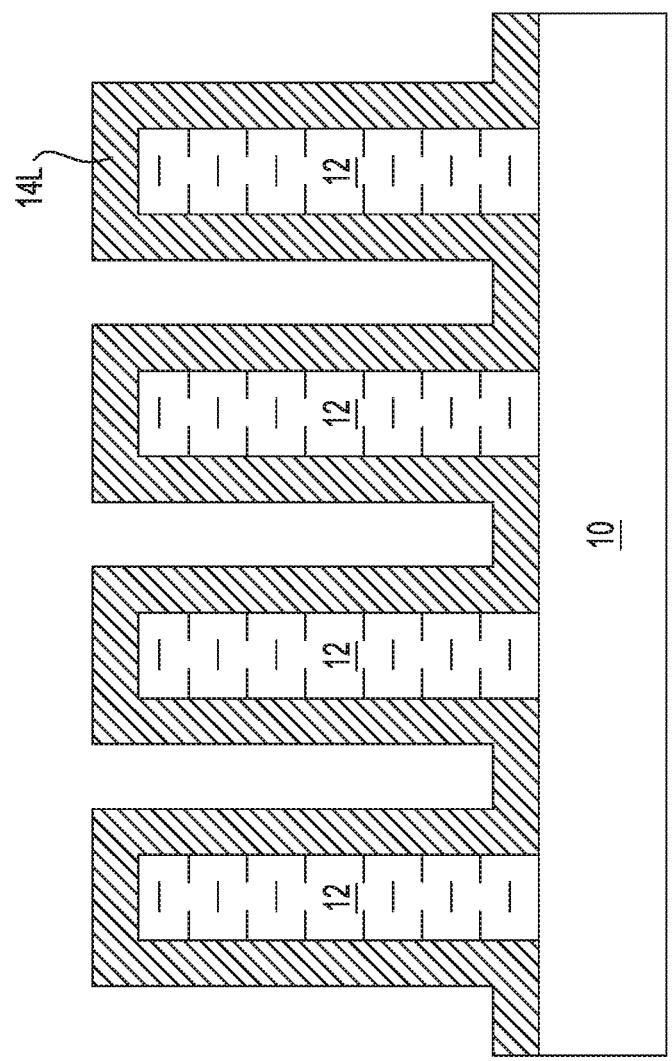
FIG. 2 is a cross sectional view of the exemplary semiconductor structure of FIG. 1 after forming a layer of resistive material on the exposed surface of the substrate and on exposed sidewalls and a topmost surface of each semiconductor fin.

Referring now to FIG. 2, there is illustrated the exemplary semiconductor structure of FIG. 1 after forming a layer of resistive material 14L on the exposed surface of the substrate 10 and on exposed sidewalls and a topmost surface of each semiconductor fin 12. The layer of resistive material 14L is a continuous (without and breaks and/or voids) layer that straddles over each semiconductor fin 12. By "straddles over" it is meant that a material (such as, for example, the layer of resistive material 14L) is present on sidewalls and a topmost surface of another material (such as for example, the semiconductor fin 12).

The layer of resistive material 14L may include a metal or metal alloy such as, for example, titanium nitride (TiN), titanium (Ti), tantalum nitride (TaN), tantalum (Ta), tungsten nitride (WN) or tungsten (W). The metal or metal alloy that provides the layer of resistive material 14L determines, at least in part, the resistivity of the resistor of the present application. The layer of resistive material 14L may be formed utilizing a deposition process such as, for example, chemical vapor deposition (CVD), plasma enhanced chemical vapor deposition (PECVD) physical vapor deposition (PVD) or atomic layer deposition (ALD).

The layer of resistive material 14L may have a thickness from 10 nm to 100 nm. Other thicknesses that are lesser than, or greater than, the aforementioned thickness range may also be used as the thickness of the layer of resistive material 14L as long as the thickness of the layer of resistive material 14L does not fill in the entirety of gap 13. The thickness of the layer of resistive material 14L determines, at least in part, the resistivity of the resistor of the present application.

In some embodiments, the layer of resistive material 14L is a conformal layer (i.e., a material whose vertical thickness above a horizontal surface of an underlying material is the same as a lateral thickness along a sidewall surface of laterally adjacent material). In yet another embodiment, the layer of resistive material 14L is a non-conformal layer. In such an embodiment, the vertical thickness of the layer of resistive material 14L above a horizontal surface of an underlying material may be greater than the lateral thickness of the layer of resistive material 14L along the sidewalls of a laterally adjacent material.

Figure 3:
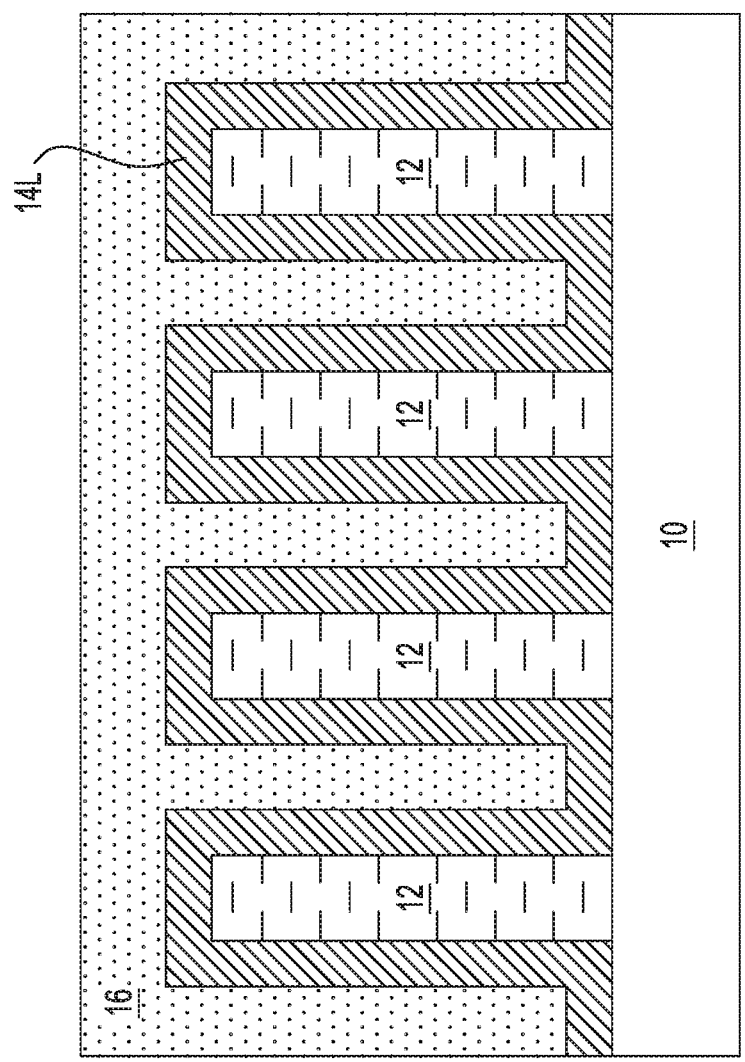
FIG. 3 is a cross sectional view of the exemplary semiconductor structure of FIG. 2 after forming a dielectric material on the layer of resistive material.

Referring now to FIG. 3, there is illustrated the exemplary semiconductor structure of FIG. 2 after forming a dielectric material 16 on the layer of resistive material 14L. The dielectric material 16 that can be employed may include a middle-of-the line (MOL) dielectric material.

The dielectric material 16 covers the substrate 10 and the entirety of the layer of resistive material 14L. The dielectric material 16 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 16. The use of a self-planarizing dielectric material as dielectric material 16 may avoid the need to perform a subsequent planarizing step.

In one embodiment, the dielectric material 16 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the dielectric material 16. The thickness of the dielectric material 16 that can be employed in the present application may vary depending on the type of material employed as well as the method that was employed in forming the same. In one embodiment, the dielectric material 16 has a thickness from 80 nm to 500 nm. Other thicknesses that are greater or lesser than the range provided above can also be used for the dielectric material 16.

Figure 4:
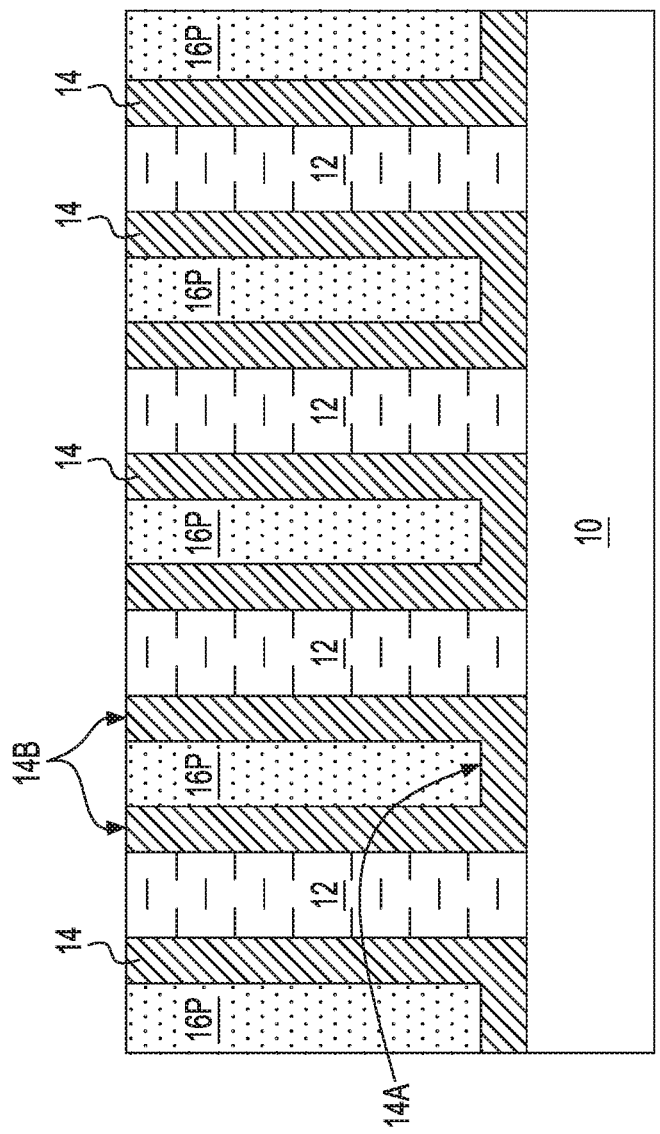
FIG. 4 is a cross sectional view of the exemplary semiconductor structure of FIG. 3 after removing an upper portion of the dielectric material and an upper portion of the layer of resistive material to expose the topmost surface of each semiconductor fin.

Referring now to FIG. 4, there is illustrated the exemplary semiconductor structure of FIG. 3 after removing an upper portion of the dielectric material 16 and an upper portion of the layer of resistive material 14L to expose the topmost surface of each semiconductor fin 12. The removal of the upper portion of the dielectric material 16 and the upper portion of the layer of resistive material 14L may be performed utilizing a planarization process such as, for example, chemical mechanical polishing and/or grinding. After removing the upper portion of the dielectric material 16 and the upper portion of the layer of resistive material 14L, a portion of the dielectric material 16 and a portion of the layer of resistive material 14L remain in the gap 13.

Each remaining portion of the dielectric material 16 is referred to herein as a dielectric material portion 16P and each remaining portion of the layer of resistive material 14L may be referred to herein as a U-shaped resistive material liner 14. By "U-shaped" it is meant a material that has a horizontal portion (labeled as element 14A) and two vertical portions (labeled as element 14B) that extend upwards from each end of the horizontal portion 14A. The vertical portions 14B of each U-shaped resistive material liner 14 are present along a sidewall of one of the semiconductor fins 12, while the horizontal portion 14A of the U-shaped resistive material liner 14 is present on a topmost surface of the substrate 10. As is shown, each U-shaped resistive material liner 14 has a topmost that is coplanar with a topmost surface of each semiconductor fin 12 as well the topmost surface of each dielectric material portion 16P. At this point of the present application, the U-shaped resistive material liners 14 are disconnected from each other.

Figure 5A:
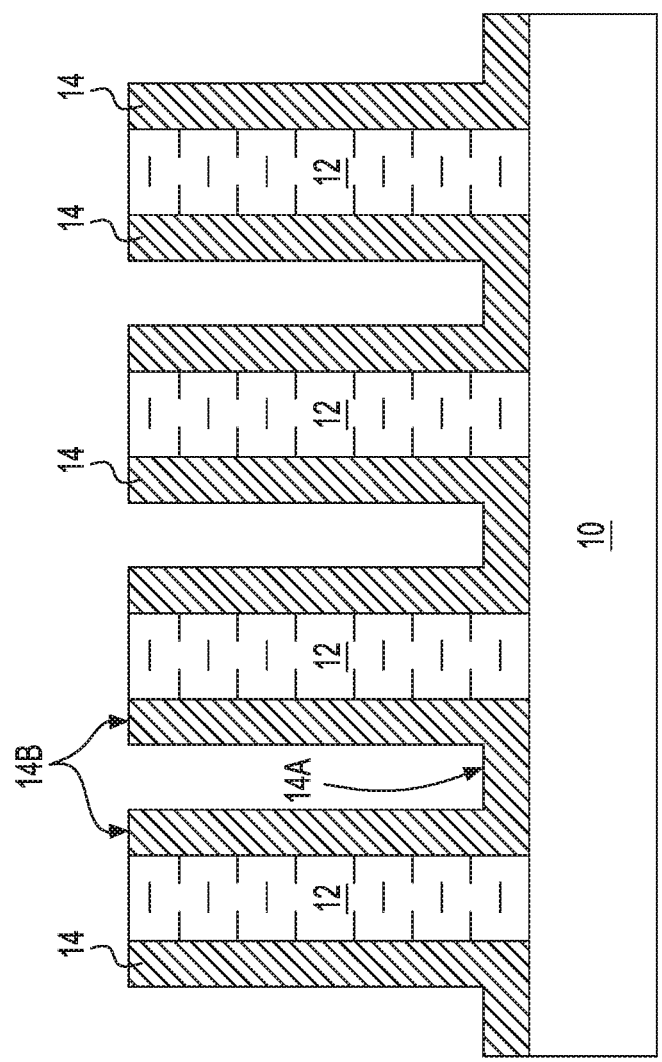
FIG. 5A is a cross sectional view of the exemplary semiconductor structure of FIG. 4 after removing the remaining portion of the dielectric material to expose each remaining portion of the layer of resistive material.
Figure 5B:
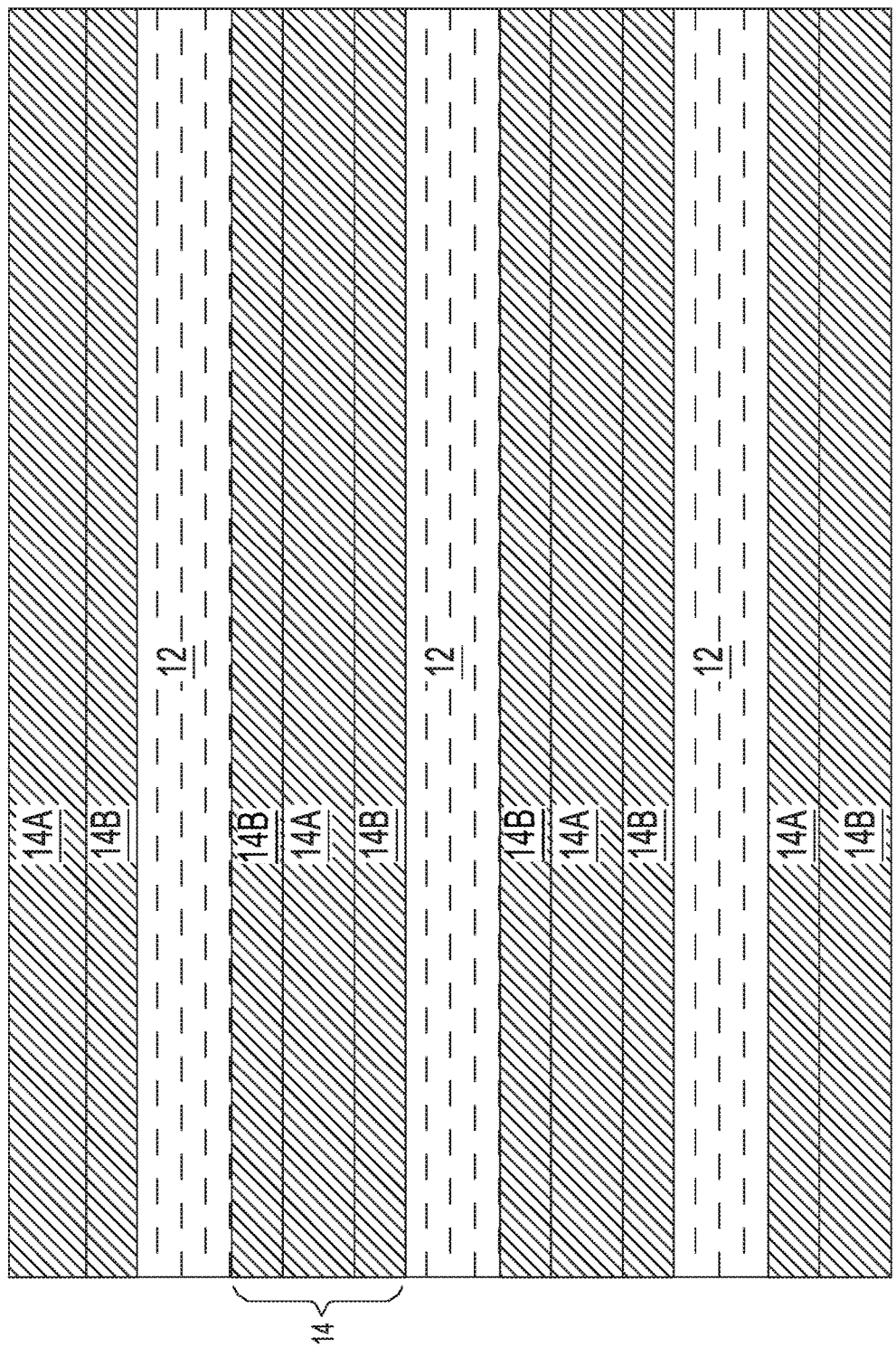
FIG. 5B is a top down view of the exemplary semiconductor structure of FIG. 5A.

Referring now to FIGS. 5A-5B, there are shown various views of the exemplary semiconductor structure of FIG. 4 after removing the remaining portion of the dielectric material (i.e., dielectric material portions 16P) to expose each remaining portion of the layer of resistive material (i.e., the U-shaped resistive material 14). In some embodiments (and as shown), each dielectric material portion 16P is entirely removed. In such an embodiment, the entirety of each U-shaped restive material liner 14 is exposed. In another embodiment (not shown), each dielectric material portion 16P is partially removed. In such an embodiment, the upper portion of each U-shaped restive material liner 14 is exposed. In yet other embodiments, this step of the present application may be omitted.

The complete or partial removal of the dielectric material portions 16P may be performed utilizing an anisotropic etching process that is selective in removing the dielectric material that provides each dielectric material portion 16P relative to the resistive material that provides the U-shaped resistive material liners 14 and the semiconductor material that provides the semiconductor fins 12. In one example, and when an oxide is employed as the dielectric material that provides each dielectric material portion 16P, each dielectric material portion 16P may be removed (entirely or partially) utilizing an anisotropic etching process in which hydrofluoric acid (HF) or a mixture of ammonium fluoride and hydrofluoric acid (so called buffer oxide etchant) can be employed as a chemical etchant. In another example, and when an oxide is employed as the dielectric material that provides each dielectric material portion 16P, each dielectric material portion 16P may be removed (entirely or partially) utilizing an anisotropic etching process in which a plasma of $CF_4$, $SF_6$ of $NF_3$ can be employed as an etchant.

Figure 6:
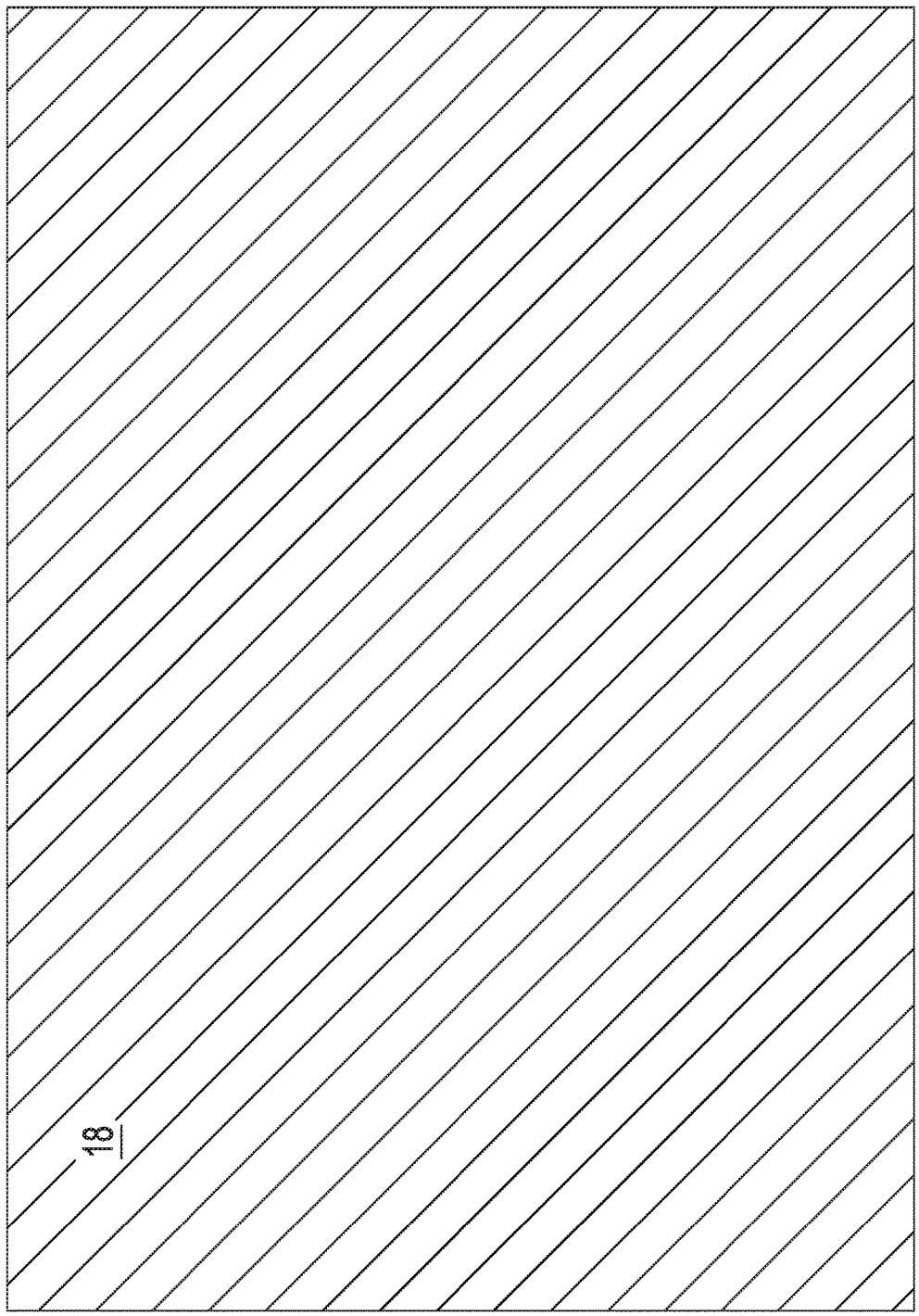
FIG. 6 is a top down view of the exemplary semiconductor structure of FIGS. 5A-5B after forming a middle-of-the-line (MOL) dielectric material.

Referring now to FIG. 6, there is illustrated the exemplary semiconductor structure of FIGS. 5A-5B after forming a middle-of-the-line (MOL) dielectric material 18. The MOL dielectric material 18 may include one of the dielectric materials mentioned above for dielectric material 16. In some embodiments, the dielectric material that provides the MOL dielectric material 18 may be the same as the dielectric material that provides dielectric material 16. In other embodiments, the dielectric material that provides the MOL dielectric material 18 may be a different dielectric material than dielectric material 16. The MOL dielectric material 18 may be formed utilizing one of the techniques mentioned above in forming dielectric material 16. The MOL dielectric material 18 may have a thickness within the range mentioned above for dielectric material 16.

In some embodiments and when the dielectric material portions 16P are completely removed, the MOL dielectric material 18 is formed within each gap 13 and directly on each U-shaped resistive material liner 14. In such an embodiment, the MOL dielectric material 18 is also formed directly on a topmost surface of each semiconductor fin 12.

In other embodiments and when the dielectric material portions 16P are partially removed, the MOL dielectric material 18 is formed within each gap 13 and directly on a remaining segment of each dielectric material portion 16P and directly on any exposed portion of each U-shaped resistive material liner 14. In such an embodiment, the MOL dielectric material 18 is also formed directly on a topmost surface of each semiconductor fin 12.

In yet further embodiments and when the dielectric material portions 16P are not removed, the MOL dielectric material 18 is formed directly on the topmost surfaces of each dielectric material portion 16P and each semiconductor fin 12.

Figure 7:
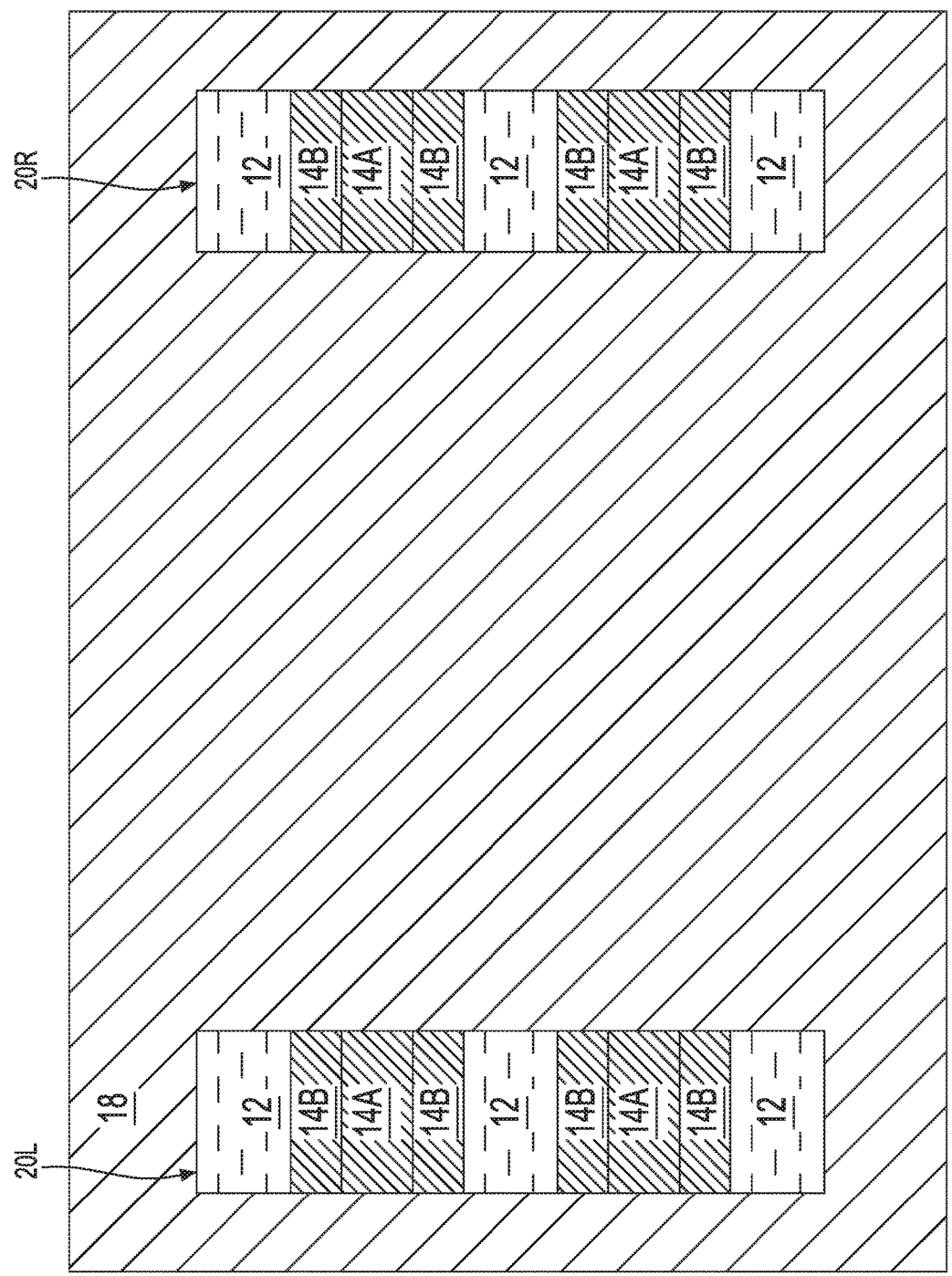
FIG. 7 is a top down view of the exemplary semiconductor structure of FIG. 6 after forming contact openings in the MOL dielectric material.

Referring now to FIG. 7, there is illustrated the exemplary semiconductor structure of FIG. 6 after forming contact openings 20L, 20R in the MOL dielectric material 18. Each contact opening 20L, 20R is spaced apart from one another. Although the present application illustrates the formation of two contact openings 20L, 20R, the present application is not limited to the formation of two contact openings. Instead, more than two contact openings can be formed as desired. The number of contact openings that are formed can also, in part, determine the resistivity of the resistor of the present application.

As is shown, each contact opening exposes a portion of a first set of the semiconductor fins 12 and a portion of a first set of the U-shaped resistive material liners 14 (including the vertical portions 14B and the horizontal portions 14A of a particular U-shaped resistive material liner 14). In the illustrated embodiment, contact opening 20L exposes a first portion of a first set of the semiconductor fins 12 and a first portion of a first set of the U-shaped resistive material liners 14, while the second contact opening exposes a second portion of the first set of the semiconductor fins 12 and a second portion of the first set of the U-shaped resistive material liners 14. The number of semiconductor fins 12 and U-shaped resistive material liners 14 that are exposed by the contact openings may vary and is not limited to two as is shown by way of one example in FIG. 7. Each contact opening 20R, 20L can be formed utilizing conventional techniques such as, for example, lithography and etching.

Figure 8:
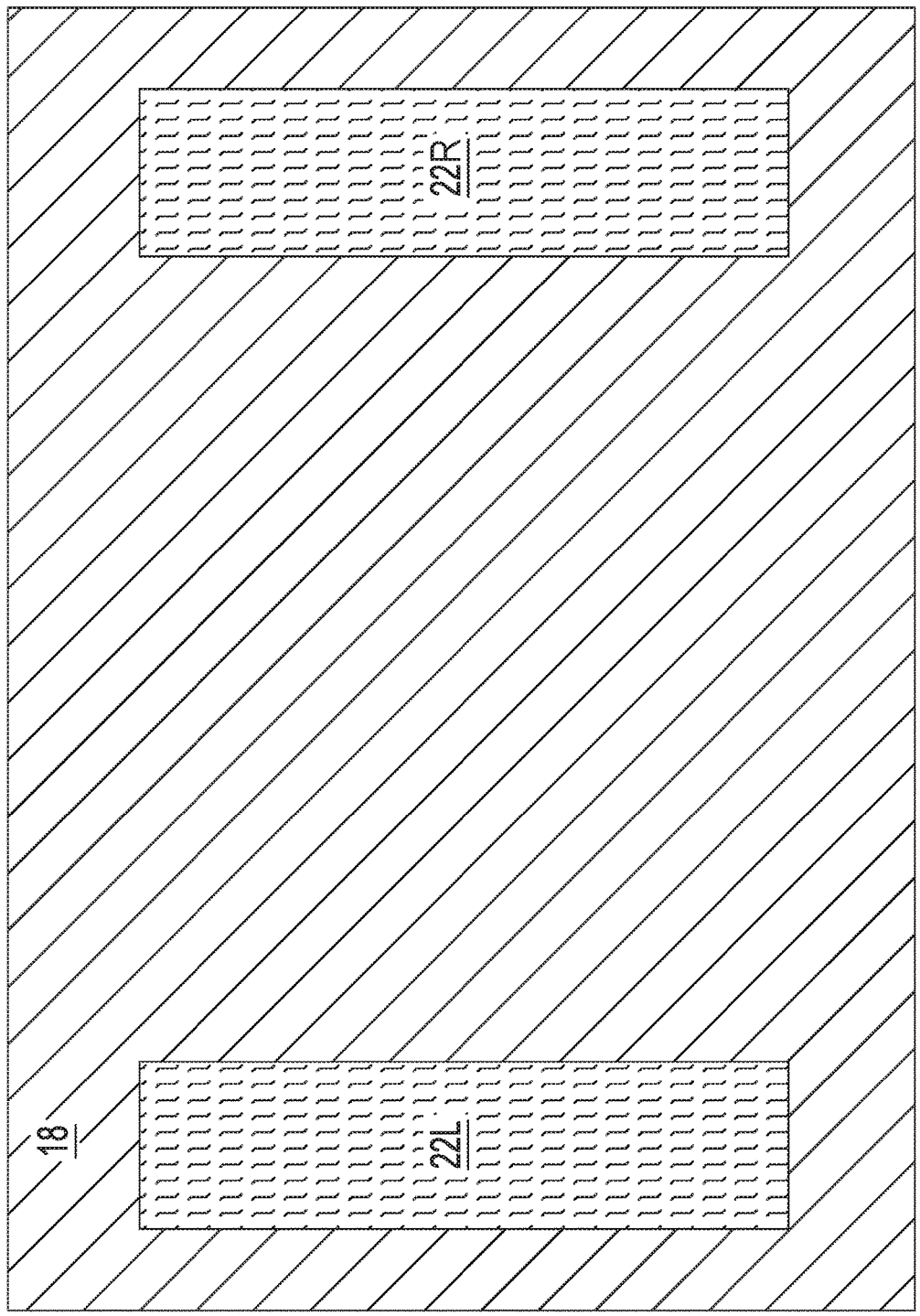
FIG. 8 is a top down view of the exemplary semiconductor structure of FIG. 7 after forming a contact structure in each contact opening.

Referring now to FIG. 8, there is illustrated the exemplary semiconductor structure of FIG. 7 after forming a contact structure 22L, 22R in each contact opening 20L, 20R; the contact structures may also be referred to as metal contact structures. Each contact structure 22L, 22R is spaced apart from each other by a specific distance. As evident by comparing FIGS. 7 and 8 to each other, each contact structure 22L, 22R is formed perpendicular to the semiconductor fins 12. Although the present application illustrates the formation of two contact structures 22L, 22R within two contact openings 20L, 20R, the present application is not limited to the formation of two contact structures. Instead, more than two contact structures can be formed as desired. The length, i.e., distance, between each contact structure 22L, 22R may also, in part, determine the resistivity of the resistor of the present application.

Each contact structure 22L, 22R may be composed of a metal or metal alloy having a lower resistivity than the metal or metal alloy that provides each U-shaped resistive material liner 14. Stated in opposite terms, the metal or metal alloy that provides each U-shaped resistive material liner 14 has a higher resistivity than the metal or metal alloy that provides each contact structure 22L, 22R. Examples of metals or metal alloys that can be employed as the contact structure 22L, 22R include, but are not to, tungsten (W), cobalt (Co), aluminum (Al), copper (Cu), or an aluminum-copper (Al—Cu) alloy. Each contact structure 22L, 22R may be formed by deposition of a contact metal or metal alloy, followed by a planarization process such as, for example, chemical mechanical polishing. Each contact structure 22L, 22R has a topmost surface that is coplanar with a topmost surface of the MOL dielectric material 18.

As is shown, each contact 22L, 22R structure lies perpendicular to each semiconductor fin 12. Also, each contact structure 22L, 22R contacts the exposed portion of the first set of the U-shaped resistive material liners 14 (notably each contact structure contacts the vertical portions and horizontal portions of each of the exposed U-shaped resistive material liners) and the exposed portion of the first set of the semiconductor fins 12. In the illustrated embodiment, the contact structure 22L contacts an exposed first portion of the first set of the semiconductor fins 12 and an exposed first portion of the first set of the U-shaped resistive material liners 14, while contact structure 22R contacts the exposed second portion of the first set of the semiconductor fins 12 and the exposed second portion of the first set of the U-shaped resistive material liners 14.

It is noted that the desired resistivity value of the structure can be tuned by any of the following: (1) choice of resistive material employed as the U-shaped resistive material liner 14, (2) the thickness of the U-shaped resistive material liner 14, (3) the number of semiconductor fins 12 and U-shaped resistive material liners 14 exposed by the contact openings 20A, 20B, (4) length between contact structures 22L, 22R, and (5) height of each semiconductor fin 12.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of semiconductor fins extending upward from a surface of a substrate;
a U-shaped resistive material liner located between each neighboring pair of semiconductor fins;
a middle-of-the-line (MOL) dielectric material located above each U-shaped resistive material liner and a topmost surface of each semiconductor fin; and
contact structures located in the MOL dielectric material and contacting a portion of a first set of the semiconductor fins and a portion of a first set of the U-shaped resistive material liners.

2. The semiconductor structure of claim 1, wherein the each contact structure lies perpendicular to each semiconductor fin.

3. The semiconductor structure of claim 1, wherein a topmost surface of each U-shaped resistive material liner is coplanar with a topmost surface of each semiconductor fin.

4. The semiconductor structure of claim 1, wherein each U-shaped resistive material liner is composed of a metal or metal alloy having a higher resistivity than a metal or metal alloy that provides each contact structure.

5. The semiconductor structure of claim 4, wherein each U-shaped resistive liner is composed of titanium nitride (TiN), titanium (Ti), tantalum nitride (TaN), tantalum (Ta), tungsten nitride (WN) or tungsten (W).

6. The semiconductor structure of claim 5, wherein each contact structure is composed of tungsten (W), cobalt (Co), aluminum (Al), copper (Cu), or an aluminum-copper (Al—Cu) alloy.

7. The semiconductor structure of claim 1, wherein a horizontal portion of each U-shaped resistive material liner has a vertical thickness that is greater than a lateral thickness of each vertical portion of each U-shaped resistive material liner.

8. The semiconductor structure of claim 1, wherein the substrate is a remaining portion of a bulk semiconductor substrate.

9. The semiconductor structure of claim 1, wherein the substrate is an insulator layer.

10. The semiconductor structure of claim 1, further comprising another dielectric material located beneath the MOL dielectric material and in a gap located between each semiconductor fin.

11. The semiconductor structure of claim 1, wherein the U-shaped resistive material liner has a vertical portion that covers an entirety of a sidewall surface of the semiconductor fins of the neighboring pair of semiconductor fins.

12. The semiconductor structure of claim 11, wherein the U-shaped resistive material liner has a horizontal portion having a bottommost surface that is in direct physical contact with a topmost surface of the substrate.

13. The semiconductor structure of claim 12, wherein the bottommost surface of the U-shaped resistive material liner is coplanar with a bottommost surface of each of the neighboring pairs of semiconductor fins.

14. The semiconductor structure of claim 1, wherein the contact structures have topmost surfaces that are coplanar with each other and coplanar with a topmost surface of the MOL dielectric material.

15. The semiconductor structure of claim 1, wherein each contact structure contacts vertical portions and a horizontal portion of each U-shaped resistive material liner of the first set of U-shaped resistive material liners and a topmost surface of each semiconductor fin of the first set of semiconductor fins.

16. The semiconductor structure of claim 1, wherein each semiconductor fin has a same height and same width.

17. The semiconductor structure of claim 1, wherein each semiconductor fin has a height from 20 nm to 200 nm, and a width from 5 nm to 30 nm.

18. The semiconductor structure of claim 1, wherein a pitch between each semiconductor fin is from 20 nm to 100 nm.

\* \* \* \* \*